(12) United States Patent
Pang et al.

(10) Patent No.: US 11,949,397 B2
(45) Date of Patent: Apr. 2, 2024

(54) BULK ACOUSTIC WAVE RESONATOR AND MANUFACTURING METHOD THEREFOR

(71) Applicant: ROFS Microsystem (Tianjin) Co., Ltd, Tianjin (CN)

(72) Inventors: Wei Pang, Tianjin (CN); Menglun Zhang, Tianjin (CN); Chen Sun, Tianjin (CN)

(73) Assignee: ROFS Microsystem (Tianjin) Co., Ltd, Tianjin (CN)

( * ) Notice: Subject to any disclaimer, the term of this patent is extended or adjusted under 35 U.S.C. 154(b) by 551 days.

(21) Appl. No.: 16/968,926

(22) PCT Filed: Feb. 2, 2019

(86) PCT No.: PCT/CN2019/074534
§ 371 (c)(1),
(2) Date: Aug. 11, 2020

(87) PCT Pub. No.: WO2019/154345
PCT Pub. Date: Aug. 15, 2019

(65) Prior Publication Data
US 2021/0050839 A1 Feb. 18, 2021

(30) Foreign Application Priority Data
Feb. 11, 2018 (CN) .......................... 201810141419.7

(51) Int. Cl.
*H03H 9/02* (2006.01)
*H03H 3/02* (2006.01)
(Continued)

(52) U.S. Cl.
CPC .......... *H03H 9/02086* (2013.01); *H03H 3/02* (2013.01); *H03H 9/02031* (2013.01);
(Continued)

(58) Field of Classification Search
CPC ........... H03H 9/02086; H03H 9/02031; H03H 9/02133; H03H 9/132; H03H 9/173; H03H 9/175; H03H 9/176
See application file for complete search history.

(56) References Cited

U.S. PATENT DOCUMENTS

2005/0179508 A1 8/2005 Sato
2011/0084779 A1* 4/2011 Zhang ................ H03H 9/02086
333/187
(Continued)

FOREIGN PATENT DOCUMENTS

CN 101908865 A 12/2010

*Primary Examiner* — Bryan P Gordon
(74) *Attorney, Agent, or Firm* — Bay State IP, LLC (57) ABSTRACT

The invention discloses a bulk acoustic wave resonator and a manufacturing method thereof, the bulk acoustic wave resonator comprising: an air gap arranged at the external of the effective piezoelectric region, the air gap being formed between the upper electrode and the piezoelectric layer and/or between the piezoelectric layer and the substrate, and covering the end part, proximal to the air gap, of the lower electrode or connecting to the end part of the lower electrode, wherein the air gap is provided with a first end proximal to the effective piezoelectric region, and at least a portion of the upper surface, starting from the first end, of the air gap is an arch-shaped upper surface. The bulk acoustic wave resonator of the present invention capable of increasing a quality factor (Q) and an effective electromechanical coupling coefficient ($K^2_{t,eff}$) and improving the electrostatic discharge (ESD) immunity.

19 Claims, 8 Drawing Sheets (51) Int. Cl.
*H03H 9/13* (2006.01)
*H03H 9/17* (2006.01)

(52) U.S. Cl.
CPC ........ *H03H 9/02133* (2013.01); *H03H 9/132* (2013.01); *H03H 9/173* (2013.01); *H03H 9/175* (2013.01); *H03H 9/176* (2013.01); H03H 2003/021 (2013.01); H03H 2003/025 (2013.01)

(56) References Cited

U.S. PATENT DOCUMENTS

| | | | | |
|---|---|---|---|---|
| 2012/0161902 | A1* | 6/2012 | Feng | H03H 9/175 333/187 |
| 2013/0181579 | A1* | 7/2013 | Shin | H10N 30/40 310/346 |
| 2014/0125202 | A1* | 5/2014 | Choy | H03H 9/175 310/365 |
| 2014/0125203 | A1* | 5/2014 | Choy | H03H 9/173 310/365 |
| 2014/0139077 | A1* | 5/2014 | Choy | H03H 9/02149 310/365 |
| 2015/0326200 | A1* | 11/2015 | Grannen | H03H 9/02102 310/346 |
| 2016/0035960 | A1* | 2/2016 | Lee | H03H 9/173 216/13 |
| 2018/0152168 | A1* | 5/2018 | Han | H03H 9/02118 |

* cited by examiner (Prior Art)

FIG. 1

(Prior Art)

BULK ACOUSTIC WAVE RESONATOR AND MANUFACTURING METHOD THEREFOR

FIELD OF THE APPLICATION

The present disclosure relates to a bulk acoustic wave resonator, in particular to a bulk acoustic wave resonator capable of increasing a quality factor (Q) and an effective electromechanical coupling coefficient ($K^2_{t,\mathit{eff}}$) and improving the electrostatic discharge (ESD) immunity of a resonator and a method for manufacturing a bulk acoustic wave resonator.

BACKGROUND OF THE APPLICATION

A thin film bulk acoustic resonator manufactured by longitudinal resonance of a piezoelectric film in a thickness direction is used as a feasible alternative of a surface acoustic wave device and a quartz crystal resonator in the aspects such as human-machine communication and high-speed serial pattern data application. A radio-frequency front-end bulk acoustic wave filter/duplexer supplies superior filter characteristic, such as low insertion loss, a steep transition band, relatively large power capacity and relatively strong electrostatic discharge (ESD) immunity. A high-frequency thin film bulk acoustic resonator with ultra-low frequency temperature drift is low in phase noise and power consumption as well as large in bandwidth modulation range. Beyond that, these micro thin film resonators use a CMOS-compatible processing process on a silicon substrate, such that the unit cost may be lowered, and integration of the micro thin film resonators to a CMOS circuit is facilitated.

The bulk acoustic wave resonator comprises an acoustic mirror, two electrodes and a piezoelectric material layer, called as a piezoelectric excitation device, between the two electrodes. A lower electrode and an upper electrode are also excitation electrodes and have the effect of causing mechanical oscillation of each of layers of the resonator. The acoustic mirror forms acoustic isolation between the bulk acoustic resonator and the substrate.

Figure 1:
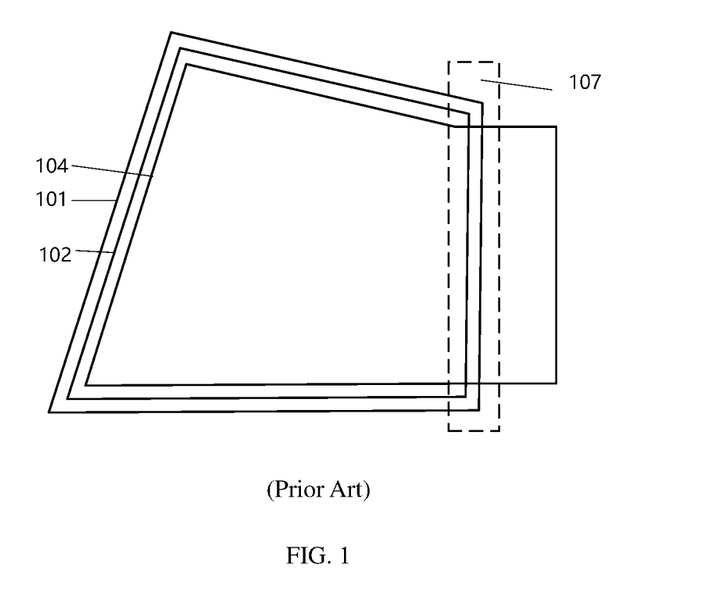
FIG. 1 is a top view of a traditional bulk acoustic wave resonator.

FIG. 1 is a top view of a traditional bulk acoustic wave resonator. The acoustic mirror 101 is constituted by an air cavity formed in the substrate and has the effect of approximately converting acoustic impedance of the substrate to that of air. A most portion of the lower electrode 102 should be arranged on the inner side of the boundary of the acoustic mirror 101. A portion of the upper electrode 101 should be arranged across a bottom electrode 102 at a connecting edge 107.

The performance of the thin film bulk acoustic wave resonator may be characterized by two parameters, such as the effective electromechanical coupling coefficient ($K^2_{t,\mathit{eff}}$) and the quality factor (Q). The larger the effective $K^2_{t,\mathit{eff}}$ value is, the wider a bandwidth of a radio-frequency filter is, or the larger an adjustable range of a voltage controlled resonator is. For the resonator, it is important that the piezoelectric layer itself should have a relatively high $K^2_{t,\mathit{eff}}$ value and a direction of a polarization axis of the piezoelectric layer that coincides with a thickness direction of a film, such that the effective $K^2_{t,\mathit{eff}}$ value may reach its maximum. The quality factor Q influences both the insertion loss of the radio-frequency filter and the uniqueness of a vibration mode of a voltage-controlled oscillator. Although oscillation is related to various energy consumption mechanisms, such as acoustics damping (material loss) and waves decided by the boundary condition of the resonator and escaping from the side surface, a good columnar crystal structure of the piezoelectric film and the orientation of a C axis are among the top influences on the performance of a bulk acoustic wave device. The crystal structure of the piezoelectric film deposited on an electrode depends on the roughness of the electrode below and its crystal structure to a great extent, and the underlying electrode with a smooth surface and sharp textures is the most ideal. When depositing, the piezoelectric layer may follow structural textures of the underlying electrode and is easily broken at the position with a relatively sharp morphology of the underlying electrode, for example, a steep edge of the electrode with an approximately vertical edge may be formed. The electrostatic discharge (ESD) immunity of the resonator may be greatly weakened by the breakage of the piezoelectric layer.

Figure 2:
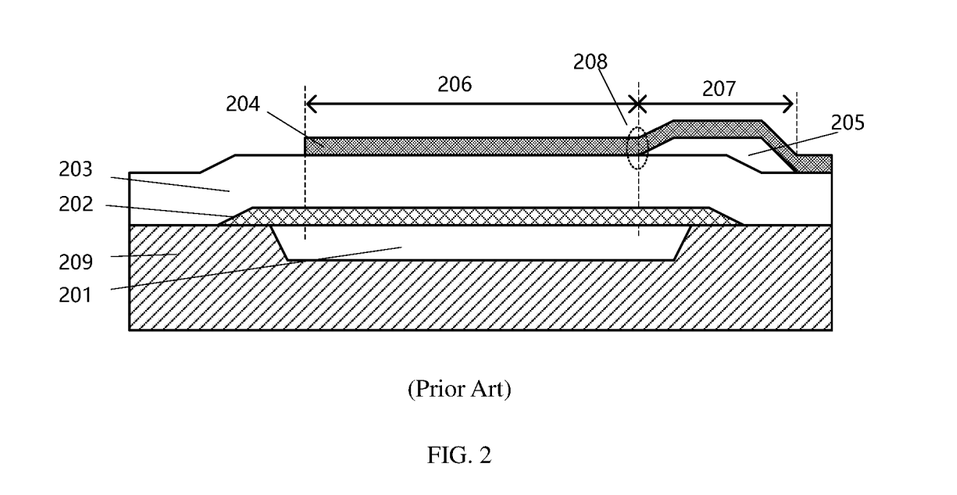
FIG. 2 is a section view of an existing bulk acoustic wave resonator.

FIG. 2 is a cross-sectional view of a structure of a prior art bulk acoustic wave resonator. The resonator is provided with a substrate 209 with an upper surface and an acoustic mirror inlaid into the substrate 209. The acoustic mirror is an air cavity 201 with a cross section being a trapezium, and an upper bottom of the trapezium is larger than a lower bottom. A sandwich piezoelectric stacking structure constituted by a lower electrode 202, a piezoelectric layer 203 and an upper electrode 204 is arranged at the upper part of the air cavity 201, wherein an effective piezoelectric stacking region 206 is defined by the contacting overlapping portions of the lower electrode 202, the piezoelectric layer 203 and the upper electrode 204. The lower electrode 202 has a trapezoidal cross section, and an upper bottom of the trapezium is smaller than a lower bottom. The two ends of the lower electrode 202 extend beyond the range of an upper bottom edge of the air cavity 201 and keep contact to an upper surface of the substrate 209. A stepped structure of the piezoelectric layer 203 on the trapezoidal lower electrode 202 is formed. The upper electrode 204 is divided into a main body portion and an extension end, and the extension end of the upper electrode 204 extends across a trapezoidal structure of the piezoelectric layer 203 to form a region 207 of a bridge structure with a trapezoidal structure. A lower surface of the bridge structure portion of the upper electrode 204 remains separated from the upper structure of the piezoelectric layer 203 under the bridge structure to form an air gap 205 in an enclosing manner. A boundary, proximal to one side of the effective piezoelectric stacking region 206, of the air gap 205 is located in a first step range of the piezoelectric layer 203, while the other boundary is located in a second step range of the piezoelectric layer 203. However, the thin film bulk acoustic resonator of the structure still have many defects and some room for improvement in the aspects of the electrical and mechanical performance and the reliability.

SUMMARY OF THE INVENTION

In view of the above problems in the related art, the present invention proposes a bulk acoustic wave resonator and a manufacturing method thereof. The bulk acoustic wave resonator has simple structure, high Q value, high electromechanical coupling coefficient and enhanced electrostatic discharge capability.

The technical solution of the present invention is implemented as follows:

A bulk acoustic wave resonator is provided according to an aspect of the invention, comprising a substrate, a lower electrode arranged on the substrate, a piezoelectric layer arranged on the lower electrode, an upper electrode arranged on the piezoelectric layer and an acoustic mirror arranged between the substrate and the lower electrode, wherein mutual overlapping regions of the upper electrode, the piezoelectric layer and the lower electrode in a thickness direction form an effective piezoelectric region, and the effective piezoelectric region in the thickness direction is located in a region, in which the acoustic mirror is located.

The bulk acoustic wave resonator further comprising: an air gap arranged at the external of the effective piezoelectric region, the air gap being formed between the upper electrode and the piezoelectric layer and/or between the piezoelectric layer and the substrate, and covering the end part, proximal to the air gap, of the lower electrode or connecting to the end part of the lower electrode.

Wherein the air gap is provided with a first end proximal to the effective piezoelectric region, and at least a portion of the upper surface, starting from the first end, of the air gap is an arch-shaped upper surface.

According to an embodiment of the invention, the at least a portion of the upper surface, starting from the first end, is tangent to a horizontal plane passing through the first end.

According to an embodiment of the invention, a portion of the upper surface, starting from the first end, is a sunken arch-shaped upper surface.

According to an embodiment of the invention, the air gap is further provided with a protruded arch-shaped upper surface connected to the sunken arch-shaped upper surface.

According to an embodiment of the invention, the air gap is further provided with a flat upper surface connected to the sunken arch-shaped upper surface.

According to an embodiment of the invention, a portion of the upper surface, starting from the first end, is a protruded arch-shaped upper surface.

According to an embodiment of the invention, a portion of the upper electrode, covering the air gap and arranged at the external of the effective piezoelectric region, is provided with a highest point, the highest point being higher than a portion of the upper electrode arranged in the effective piezoelectric region.

According to an embodiment of the invention, the portion of the upper electrode, covering the air gap and arranged at the external of the effective piezoelectric region, is not higher than the portion of the upper electrode arranged in the effective piezoelectric region.

According to an embodiment of the invention, a thickness of the piezoelectric layer arranged at the external of the effective piezoelectric region is decreased progressively in a direction, going distally from the effective piezoelectric region.

According to an embodiment of the invention, the lower electrode covers the acoustic mirror, and the end part of the lower electrode is directly in contact to the upper surface of the substrate.

According to an embodiment of the invention, the lower electrode covers a portion of the acoustic mirror, and the end part, proximal to the air gap, of the lower electrode is arranged above the acoustic mirror.

According to an embodiment of the invention, the end part of the lower electrode comprises a side edge of the lower electrode, the side edge being a vertical side edge, and the air gap is connected to the top end of the vertical side edge.

According to an embodiment of the invention, the end part of the lower electrode comprises a side edge of the lower electrode, the side edge being an inclined side edge, and the air gap is connected to the top end of the inclined side edge.

According to an embodiment of the invention, the top end of the inclined side edge is located farther from the effective piezoelectric region than the bottom end of the inclined side edge, and the at least a portion of the upper surface, starting from the first end, is tangent to a plane, in which the inclined side edge is located.

According to an embodiment of the invention, the first end of the air gap is coincident with a boundary of the effective piezoelectric region.

According to an embodiment of the invention, the acoustic mirror is an air cavity inlaid into the substrate, and the upper surface of the air cavity is flush with that of the substrate.

According to an embodiment of the invention, the air gap is filled with a medium, the filled medium material comprising one or more or a combination of silicon dioxide, silicon nitride, silicon carbide, porous silicon, fluorinated amorphous carbon, fluorine polymer, parylene, polyarylether, hydrogen silsesquioxane, crosslinked polystyrene polymer, bisbenzocyclobutenes, fluorinated silicon dioxide, carbon doped oxide and diamond.

According to an embodiment of the invention, a cross section of the lower electrode is a first trapezium, and an upper bottom edge of the first trapezium is smaller than a lower bottom edge of the first trapezium; and a cross section of the acoustic mirror is a second trapezium, and an upper bottom edge of the second trapezium is larger than a lower bottom edge of the second trapezium.

According to an embodiment of the invention, the piezoelectric layer is made of any one of following materials: aluminum nitride (AlN), zinc oxide (ZnO), PZT or R-doped aluminum nitride (AlRN), wherein R, as an doped element, is a metal or non-metallic element.

A method for manufacturing a bulk acoustic wave resonator is provided according to another aspect of the invention, comprising: forming an acoustic mirror on a substrate, depositing a lower electrode on the substrate and the acoustic mirror, depositing a piezoelectric layer on the lower electrode, and depositing an upper electrode on the piezoelectric layer;

the method further comprising:

before depositing the piezoelectric layer, forming a patterned first sacrificial layer on the lower electrode and the substrate; and/or before depositing the upper electrode, forming a patterned second sacrificial layer on the piezoelectric layer; and etching the first sacrificial layer and the second sacrificial layer to form an air gap, the air gap covering the end part, proximal to the air gap, of the lower electrode or connecting to the end part of the lower electrode.

Wherein the air gap is provided with a first end proximal to the effective piezoelectric region, and at least a portion of the upper surface, starting from the first end, of the air gap is an arch-shaped upper surface, the arch-shaped upper surface being tangent to a horizontal plane passing through the first end.

According to an embodiment of the invention, after forming the first sacrificial layer, the method further comprises: adjusting a stress ratio of the piezoelectric layer to the first sacrificial layer.

For present disclosure, by arranging the air gap with the arch-shaped upper surface, electric fields of a defect end surface of the lower electrode and a region, in which defects, caused by the defect end surface, of a portion of the piezoelectric layer is located, such that the electromechanical coupling activity of the defect region is weakened, and a final result is to increase the effective electromechanical coupling coefficient $K^2_{t,eff}$ of the resonator; and on the other hand, an arch-shaped bridge structure according to the present disclosure is a structure with very strong geometrical morphology continuity, and more continuous transverse-mode acoustic bandwidth coverage and a more sufficient transverse parasitic mode acoustic reflector may be transversely supplied, such that energy loss caused by transverse leakage of the transverse-mode acoustic waves is more sufficiently inhibited, and the Q value of the resonator is increased; and furthermore, by smooth transition with a flat structure through an arch-shaped structure, the possibility of stress accumulation and electrostatic discharge caused by the non-smooth structure of a sharp corner may be greatly reduced, the reliability of the device is greatly strengthened.

BRIEF DESCRIPTION OF THE ACCOMPANYING DRAWINGS

In order to illustrate the technical solutions in the embodiments of the present application in the prior art more clearly, the drawings which are required to be used in the description of the embodiments of the present application are briefly described below. It is obvious that the drawings described below are only some embodiments of the present disclosure. It is apparent to those skilled in the art that other drawings may be obtained based on the accompanying drawings without giving inventive effort.

FIG. 3A-FIG. 8B are section views of bulk acoustic wave resonators according to different embodiments of the present disclosure.

DETAILED DESCRIPTION OF THE PREFERRED EXAMPLES

The technical solutions in the embodiments of the present disclosure are described clearly and completely in the following with reference to accompanying drawings in the embodiments of the present disclosure. Apparently, the described embodiments are only part rather than all of the embodiments of the present disclosure. Based on the embodiments of the present disclosure, all the other embodiments obtained by those of ordinary skill in the art are within the scope of the present disclosure.

According to the embodiments of the present disclosure, a bulk acoustic wave resonator is provided. The bulk acoustic wave resonator comprises a substrate, a lower electrode arranged on the substrate, a piezoelectric layer arranged on the lower electrode, an upper electrode arranged on the piezoelectric layer and an acoustic mirror arranged between the substrate and the lower electrode, wherein mutual overlapping regions of the upper electrode, the piezoelectric layer and the lower electrode in a thickness direction form an effective piezoelectric region, and the effective piezoelectric region is located in a region, in which the acoustic mirror is located, in the thickness direction;

The bulk acoustic wave resonator further comprises: an air gap arranged at the external of the effective piezoelectric region, the air gap being formed between the upper electrode and the piezoelectric layer and/or between the piezoelectric layer and the substrate and covering the end part, proximal to the air gap, of the lower electrode or connecting to the end part of the lower electrode, wherein the air gap is provided with a first end proximal to the effective piezoelectric region and at least a portion of an upper surface, starting from a first end, of the air gap is an arch-shaped upper surface.

For the bulk acoustic wave resonator of the present disclosure, on one hand, by arranging the air gap with the arch-shaped upper surface, electric fields of a defect end surface of the lower electrode and a region, in which defects, caused by the defect end surface, of a portion of the piezoelectric layer is located, are greatly weakened, such that the electromechanical coupling activity of the defect region is weakened, and a final result is to increase the effective electromechanical coupling coefficient $K^2_{t,eff}$ of the resonator; and on the other hand, a bridge structure of the upper electrode of the traditional resonator as shown in FIG. 2 is of a stepped form, the formed air gap is transversely divided into a plurality of segments with discontinuous impedance, transverse-mode acoustic waves generated in the resonator may be distributed in a certain bandwidth generally, relatively overall reflection to the transverse-mode acoustic waves by the air gap formed by the traditional bridge structure cannot be guaranteed, and thus improvement to the Q value could only be achieved in a narrow frequency band or discrete frequency points. An arch-shaped bridge structure according to the present disclosure is a structure with very strong geometrical morphology continuity, and more continuous transverse-mode acoustic bandwidth coverage and a more sufficient transverse parasitic mode acoustic reflector structure may be transversely supplied, such that energy loss caused by transverse leakage of the transverse-mode acoustic waves is more sufficiently inhibited in a continuous and very wide frequency range, and the Q value of the resonator is increased at all frequencies; and furthermore, a sharp corner structure (a region 208 as shown in FIG. 2) formed by a junction of a piezoelectric stacking active region (a region 206 as shown in FIG. 2) and an inactive region (a region 207 as shown in FIG. 2) may further be formed by the traditional bridge structure. During the working process of the device, stress at the sharp corner structure would be strengthened to be capable of leading to a crack and even breakage of the upper electrode at the sharp corner structure, such that the stability of the device is greatly weakened, and improvement in the power capacity of the resonator is severely restricted. Furthermore, the possibility of discharge of a tip of each electrode may further be improved by a non-smooth transition structure, which may result in weakening of the electrostatic discharge (ESD) immunity of the device. While the novel bridge structure according to the present disclosure is in smooth transition with a flat structure through an arch-shaped structure, the possibility of stress accumulation and electrostatic discharge caused by the non-smooth structure of a sharp corner may be greatly reduced, the reliability of the device is then greatly strengthened, and thus, the Q value, the effective electromechanical coupling coefficient $K^2_{t,eff}$ and the electrostatic discharge immunity of the device are improved, the stress in each electrode of the device is weakened at the same time, and the electrical and mechanical performance and the reliability of the resonator are improved.

Figure 3A:
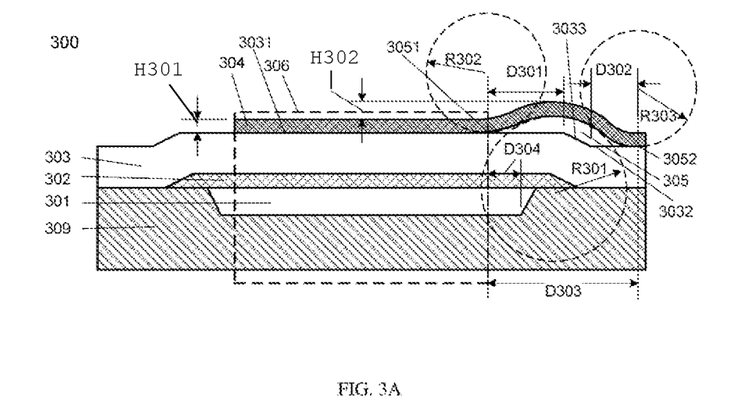

FIG. 3A shows the bulk acoustic wave resonator 300 according to a first embodiment of the present disclosure. Referring to FIG. 3A, the bulk acoustic wave resonator 300 comprises: a substrate 309, and an air cavity 301 inlaid into the substrate has the effect of the acoustic mirror. The air cavity 301 here is a specific implementation of a structure of the acoustic mirror and may further be replaced by other structures of the acoustic mirror including a Bragg reflection layer.

The bulk acoustic wave resonator 300 further comprises a lower electrode 302, a piezoelectric layer 303 and an upper electrode 304. A piezoelectric stacking effective piezoelectric region 306 is defined by overlapping regions of contact regions of the lower electrode 302, the piezoelectric layer 303 and the upper electrode 304 in a thickness direction and completely falls into a range of a lower bottom edge of the air cavity 301, wherein the two ends of the lower electrode 302 extend beyond the range of the air cavity 301 in two opposite directions respectively, such that the two ends of a lower bottom edge of the trapezoidal lower electrode 302 remain contact to an upper surface of the substrate 309, wherein the substrate 309 may be made of, but not limited to, an IC process-compatible material, such as monocrystalline silicon, quartz, glasses and gallium arsenide. The substrate 309 may be made of a single-layer material and also a multi-layer composite. The acoustic mirror, inlaid into the substrate, may be of a structure of the air cavity 301 or the Bragg reflection layer, wherein the air cavity 301 may be filled with a material, such as epoxy resin. The lower electrode 302 and the upper electrode 304 may be manufactured by one single-layer metal or many alloys of Cu, Mo, Au, W, Ti, Al, Pt, Ru, Os and the like and may further be of a multi-layer metal composite structure. The piezoelectric layer 303 may be made of, but not limited to, any one of following materials: aluminum nitride (AlN), zinc oxide (ZnO), PZT or R-doped aluminum nitride (AlRN) with a certain atomic percentage, wherein R, as an doped element, is a metal or non-metallic element, for example, scandium (Sc), and the doped aluminum nitride is AlScN.

In the embodiment, a portion, in the effective piezoelectric region 306, of the piezoelectric layer 303 is a main body portion of the piezoelectric layer, and a portion, at the external of the effective piezoelectric region 306, of the piezoelectric layer 303 is an extension end of the piezoelectric layer. Similarly, a portion, in the effective piezoelectric region 306, of the upper electrode 304 is a main body portion of the upper electrode, and a portion, at the external of the effective piezoelectric region 306, of the upper electrode 304 is an extension end of the upper electrode. Furthermore, the same rule applies for descriptions of the lower electrode 302, the air cavity 301 and the substrate 309 and descriptions of other embodiments as well.

The piezoelectric layer 303 is provided with a stepped structure which is constituted by a first step 3031, a second step 3032 and an interface 3033 between the two steps, wherein a plane of the first step 3031 is higher than that of the second step 3032.

The upper electrode 304 has a thickness H301. The extension end of the upper electrode 304 is configured to be of a convex bridge structure to enable an interface 3033 of the extension end of the upper electrode 304 and the piezoelectric layer 303 under it, a portion of the first step 3031 and a portion of the second step 3032 to form an air gap 305 in an enclosing manner, that is the air gap 305 is arranged between the upper electrode 304 and the piezoelectric layer 303.

The air gap 305 is provided with a first end 3051, proximal to the effective piezoelectric region 306, and a portion of an upper surface, starting from the first end 3051, of the air gap 305 is a sunken arch-shaped upper surface, i.e. a partial arc with R302 being a radius, the partial arc with R302 being the radius being tangent to a horizontal plane passing through the first end 3051. The air gap 305 is further provided with a protruded arch-shaped upper surface connected to the sunken arch-shaped upper surface, i.e. a partial arc with R301 being a radius; and the air gap 305 is further provided with an another sunken arch-shaped upper surface connected to the protruded arch-shaped upper surface, i.e. a partial arc with R303 being a radius, the partial arc with R303 being the radius extending to a second end 3052, going distally from the effective piezoelectric region 306, of the air gap 305.

The main body portion of the upper electrode 304 completely falls into a range of the first step 3031 of the piezoelectric layer 303. The extension end of the upper electrode 304 and an upper surface of the air gap 305 are in a same shape, such that the extension end of the upper electrode 304 is configured to be of a convex bridge structure formed by three arcs (which take R302, R301 and R303 as radii respectively, wherein R301 is larger than or equal to 10 μm and smaller than or equal to 10000 μm, R302 is larger than or equal to 6 μm and smaller than or equal to 3200 μm, and R303 is larger than or equal to 4 μm and smaller than or equal to 2800 μm). The upper surface of the convex bridge structure of the upper electrode 304 is higher than that of the main body portion of the upper electrode 304 by a distance H302, wherein H302 is larger than or equal to 50 μm and smaller than or equal to 400 μm.

Furthermore, in this embodiment, a first end 3051 of the air gap 305 is coincident with the right boundary of the effective piezoelectric region 306 and remains a distance D301 with the right end point of the first step 3031 of the piezoelectric layer 303; and the first end 3051 remains a distance D304 with the right end point of a lower bottom edge of the trapezoidal air cavity 301 at the same time. A second end 3052 of the air gap 305 falls into the second step 3032 of the piezoelectric layer 303 and remains a distance D302 with the left end point of the second step 3032 of the piezoelectric layer 303. The whole transverse range of the air gap 305 is D303, wherein D303 is larger than or equal to 5 μm and smaller than or equal to 30 μm.

Figure 3B:
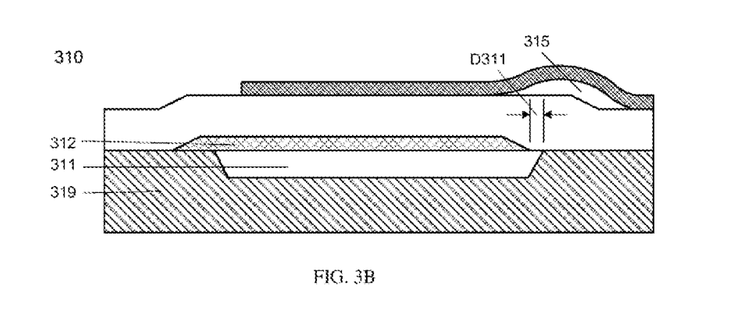

FIG. 3B shows a bulk acoustic wave resonator 310 according to a second embodiment of the present disclosure. Referring to FIG. 3B, there is a difference between the bulk acoustic wave resonator 310 and the bulk acoustic wave resonator 300 in the first embodiment that the right end part of the trapezoidal lower electrode 312, i.e. the end part, proximal to the air gap 315, of the lower electrode 312, is not in contact to the upper surface of the substrate 319. Specifically, the right end point of a lower bottom edge of the trapezoidal cross section of the lower electrode 312 falls into the range of an upper bottom edge of the trapezoidal cross section of the air cavity 311 and remains a distance D311 with the right end point of the upper bottom edge. Through such structure configuration, the contact area of the lower electrode 312 and the substrate 319 may be further reduced, such that the situation that the quantity of an acoustic energy leaking from the lower electrode into the substrate is reduced is facilitated.

Figure 4A:
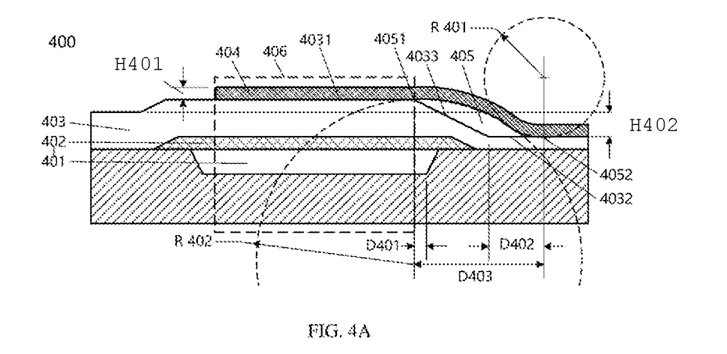

FIG. 4A shows a bulk acoustic wave resonator 400 according to a third embodiment of the present disclosure. In this embodiment, an extension end of an upper electrode 404 is configured to be of a convex bridge structure to enable an interface 4033 of the extension end of the upper electrode 404 and a piezoelectric layer 403 under it and a portion of a second step 4032 to form an air gap 405 in an enclosing manner. At least a portion of an upper surface, starting from a first end 4051, of the air gap 405 of the bulk acoustic wave resonator 400 is a protruded arch-shaped upper surface, i.e. a partial arc with R402 being a radius. The air gap 405 is further provided with a sunken arch-shaped upper surface connected to the protruded arch-shaped upper surface, i.e. a partial arc with R401 being a radius. The partial arc with R402 being the radius is substantially in tangency and transition to a horizontal plane passing through the first end 4051, wherein R401 is larger than or equal to 6 μm and smaller than or equal to 3200 μm; R402 is larger than or equal to 10 μm and smaller than or equal to 10000 μm; and accordingly, an upper surface of the convex bridge structure of the upper electrode 404 is substantially in tangency and transition to the upper surface of the main body portion of the upper electrode 404.

The first end 4051 of the air gap 405 is coincident with the right boundary of an effective piezoelectric region 406 and a right end point of a first step 4031 of the piezoelectric layer 403; and the first end 4051 remains a distance D401 with a right end point of a lower bottom edge of the trapezoidal air cavity 401 at the same time. The second end 4052 of the air gap 405 falls into the second step 4032 of the piezoelectric layer 403 and remains a distance D402 with a left end point of the second step 4032 of the piezoelectric layer 403. The whole transverse range of the air gap 405 is D403, wherein D403 is larger than or equal to 5 μm and smaller than or equal to 30 μm.

Figure 4B:
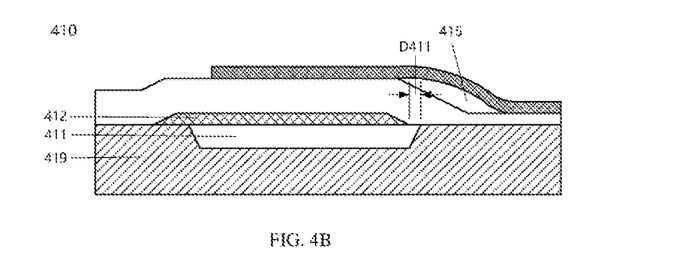

FIG. 4B shows a bulk acoustic wave resonator 410 according to a fourth embodiment of the present disclosure. There is a difference between the bulk acoustic wave resonator 410 and the bulk acoustic wave resonator 400 in the third embodiment that the right end part of the trapezoidal lower electrode 412, i.e. the end part, proximal to the air gap 415, of the lower electrode 412, is not in contact to the upper surface of the substrate 419. Specifically, a right end point of a lower bottom edge of a trapezoidal cross section of the lower electrode 412 falls into the range of an upper bottom edge of a trapezoidal cross section of an air cavity 411 and remains a distance D411 with a right end point of the upper bottom edge. Through such structure configuration, the contact area of the lower electrode 412 and the substrate 419 may be further reduced, such that the situation that the quantity of an acoustic energy leaking from the lower electrode into the substrate is reduced is facilitated.

Figure 5A:
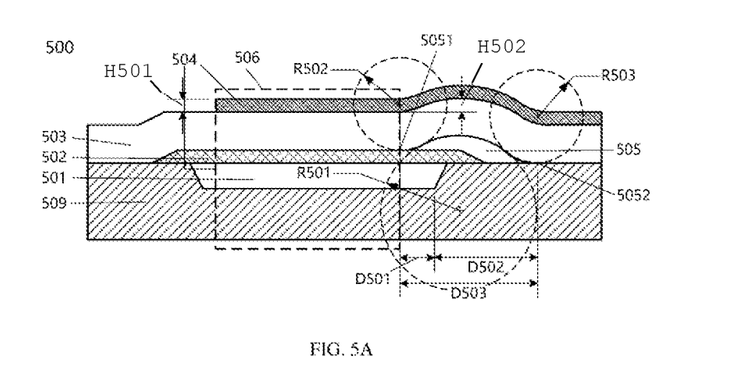

FIG. 5A shows a bulk acoustic wave resonator 500 according to a fifth embodiment of the present disclosure. In this embodiment, an extension end of a piezoelectric layer 503 and an extension end of an upper electrode 504 on the piezoelectric layer 503 are in a same shape and are both configured to be of a convex bridge structure to enable the convex bridge structure of the piezoelectric layer 503, a portion of the lower electrode 502 under the piezoelectric layer 503 and a portion of a substrate 509 to form an air gap 505 in the enclosing manner, that is the air gap 505 is arranged between the piezoelectric layer 503 and the substrate 509.

An upper surface, starting from a first end 5051, of the air gap 505 is a sunken arch-shaped upper surface, i.e. a partial arc with R502 being a radius, the partial arc with R502 being the radius being tangent to a horizontal plane passing through the first end 5051. The air gap 505 is further provided with a protruded arch-shaped upper surface connected to the sunken arch-shaped upper surface, i.e. a partial arc with R501 being a radius; and the air gap 505 is further provided with an another sunken arch-shaped upper surface connected to the protruded arch-shaped upper surface, i.e. a partial arc with R503 being a radius, the partial arc with R503 being the radius extending to a second end 5052, going distally from the effective piezoelectric region 506, of the air gap 505, wherein R501 is larger than or equal to 10 μm and smaller than or equal to 10000 μm, R502 is larger than or equal to 6 μm and smaller than or equal to 3200 μm, and R503 is larger than or equal to 6 μm and smaller than or equal to 3200 μm.

An upper surface of the convex bridge structure of the piezoelectric layer 503 is higher than that of a main body portion of the piezoelectric layer 503 by a distance H502. The upper electrode 504 has a thickness H501, and a lower surface of the upper electrode 504 is completely in contact to the upper surface of the piezoelectric layer 503, wherein H502 is larger than or equal to 50 μm and smaller than or equal to 400 μm.

In this embodiment, a first end 5051 of the air gap 505 is coincident with the right boundary of the effective piezoelectric region 506 and keeps a distance D501 with a right end point of a lower bottom edge of the trapezoidal air cavity 501; and the first end 5051 remains a distance D504 with the right end point of the lower bottom edge of the trapezoidal air cavity 501 at the same time. A second end 5052 of the air gap 505 falls on the position, beyond a lower bottom edge of a trapezoidal cross section of the lower electrode 502, of the substrate and remains a distance D502 with a right end point of a lower bottom edge. The whole transverse range of the air gap 505 is D503, wherein D503 is larger than or equal to 5 μm and smaller than or equal to 30 μm.

Figure 5B:
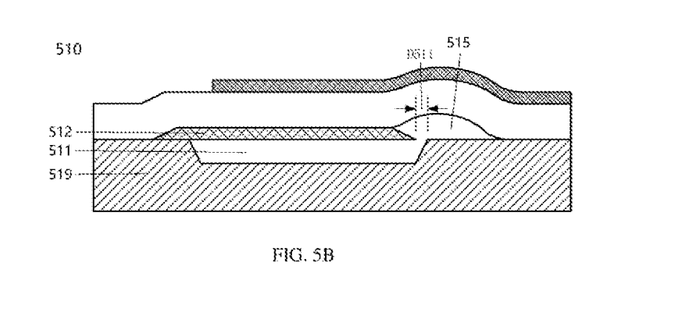

FIG. 5B shows a bulk acoustic wave resonator 510 according to a sixth embodiment of the present disclosure. There is a difference between the bulk acoustic wave resonator 510 and the bulk acoustic wave resonator 500 in the sixth embodiment that the right end part of a trapezoidal lower electrode 512, i.e. the end part, proximal to an air gap 515, of the lower electrode 512 is not in contact to an upper surface of a substrate 519. Specifically, a right end point of a lower bottom edge of a trapezoidal cross section of a lower electrode 512 falls into the range of an upper bottom edge of a trapezoidal cross section of an air cavity 511 and remains a distance D511 with a right end point of the upper bottom edge. Through such structure configuration, the contact area of the lower electrode 512 and the substrate 519 may be further reduced, such that the situation that the quantity of an acoustic energy leaking from the lower electrode into the substrate is reduced is facilitated.

Figure 6A:
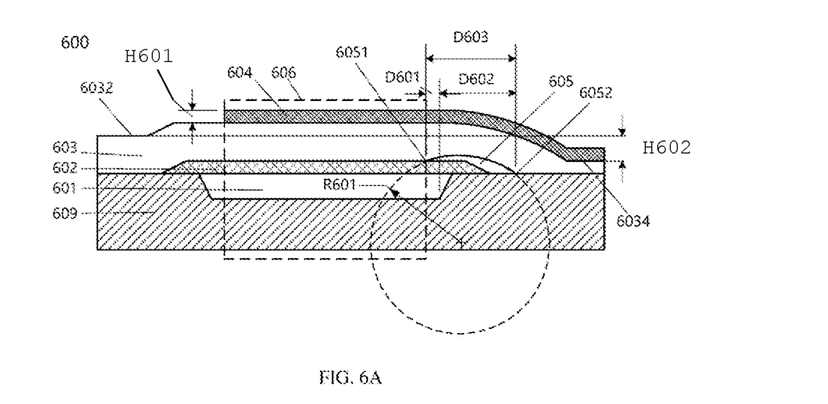

FIG. 6A shows a bulk acoustic wave resonator 600 according to a seventh embodiment of the present disclosure. In this embodiment, an extension end of a piezoelectric layer 603 and an extension end of an upper electrode 604 on the piezoelectric layer 603 are both configured to be of a convex bridge structure to enable the convex bridge structure of the piezoelectric layer 603, a portion of the lower electrode 602 under the piezoelectric layer 603 and a portion of a substrate 609 to form an air gap 605 in the enclosing manner, that is the air gap 605 is arranged between the piezoelectric layer 603 and the substrate 609.

An upper surface, starting from a first end 6051, of the air gap 605 is a protruded arch-shaped upper surface, i.e. a partial arc with R601 being a radius, wherein R601 is larger than or equal to 10 μm and smaller than or equal to 10000 μm. The partial arc with R601 being the radius extends to the second end 6052, going distally from an effective piezoelectric region 606, of the air gap 605. An upper surface of the convex bridge structure of the piezoelectric layer 603 is substantially in tangency and transition to that of the main body portion of the piezoelectric layer 603. A thickness of the extension end of the piezoelectric layer 603 is decreased progressively, such that an upper surface of the second step 6032 of the piezoelectric layer 603 is higher than that of a horizontal extension end 6034 by a distance H602.

The upper electrode 604 has a thickness H601, and a lower surface of the upper electrode 604 is completely in contact to an upper surface of the piezoelectric layer 603. A first end 6051 of the air gap 605 is coincident with the right boundary of an effective piezoelectric region 606 and remains a distance D601 with a right end point of a lower bottom edge of a trapezoidal air cavity 601; and the first end 6051 remains a distance D604 with the right end point of the lower bottom edge of the trapezoidal air cavity 601 at the same time. A second end 6052 of the air gap 605 falls on the position, beyond a lower bottom edge of a trapezoidal cross section of the lower electrode 602, of the substrate and remains a distance D602 with a right end point of the lower bottom edge. The whole transverse range of the air gap 605 is D603, wherein D603 is larger than or equal to 5 μm and smaller than or equal to 30 μm.

Figure 6B:
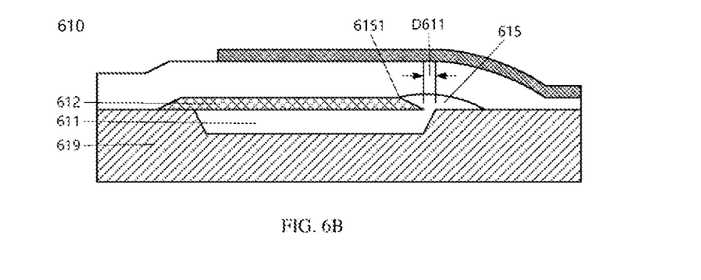

FIG. 6B shows a bulk acoustic wave resonator 610 according to an eighth embodiment of the present disclosure. there is a difference between the bulk acoustic wave resonator 610 and the bulk acoustic wave resonator 600 in the seventh embodiment that the right end part of a trapezoidal lower electrode 612, i.e. the end part, proximal to an air gap 615, of the lower electrode 612 is not in contact to an upper surface of a substrate 619. Specifically, a right end point of a lower bottom edge of a trapezoidal cross section of the lower electrode 612 falls into the range of an upper bottom edge of a trapezoidal cross section of an air cavity 611 and remains a distance D611 with a right end point of the upper bottom edge; and A first end 6151 of the air gap 615 is coincident with the right end point of the upper bottom edge of the trapezoidal cross section of the lower electrode 612 at the same time. Through such structure configuration, the contact area of the lower electrode 612 and the substrate 619 may be further reduced, such that the situation that the quantity of an acoustic energy leaking from the lower electrode into the substrate is reduced is facilitated.

Figure 6C:
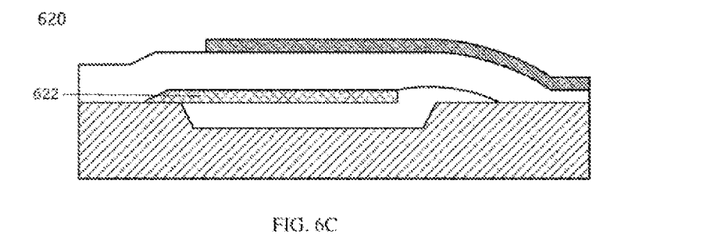

FIG. 6C shows a bulk acoustic wave resonator 620 according to a ninth embodiment of the present disclosure. There is a difference between the bulk acoustic wave resonator 620 and the bulk acoustic wave resonator 610 in the eighth embodiment that a right waist of a trapezoidal cross section of a lower electrode 622 is a vertical side edge. Through such structure configuration, a width of an air cavity near the right end part of the lower electrode 622 may be further increased to improve the acoustic reflection performance of the air cavity.

Figure 6D:
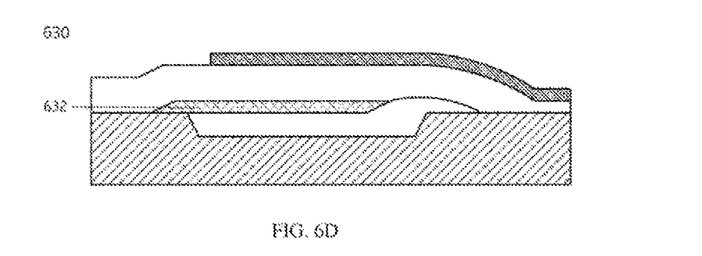

FIG. 6D shows a bulk acoustic wave resonator 630 according to a tenth embodiment of the present disclosure. There is a difference between the bulk acoustic wave resonator 630 and the bulk acoustic wave resonator 610 in the eighth embodiment that a cross section of a lower electrode 632 is in a shape of an inclined trapezium or a parallelogram, in other words, a right waist of the cross section of the lower electrode 632 is inclined to the left, that is the top end of the right waist is arranged farther from an effective piezoelectric region than the bottom end of the right waist. And, a plane, in which the right waist of the cross section of the lower electrode 632 is located, is substantially in tangency and transition to an arch-shaped upper surface of a piezoelectric layer 632. Through such structure configuration, the stress at a right end point of an upper bottom edge of the lower electrode 632 may be effectively lowered to improve the contact stability of the lower electrode and the piezoelectric layer at the end point.

Figure 6E:
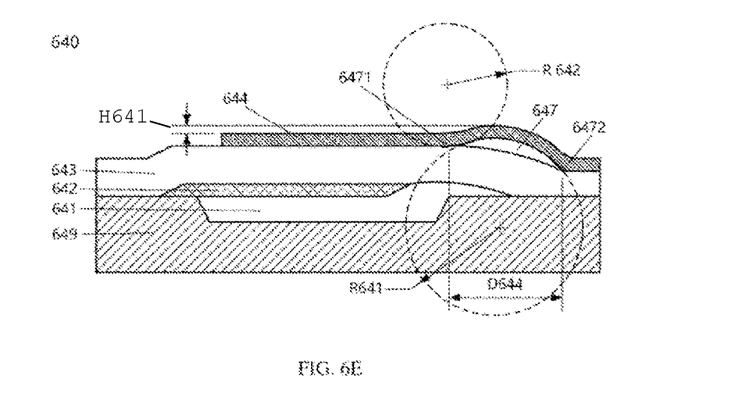

FIG. 6E shows a bulk acoustic wave resonator 640 according to an eleventh embodiment of the present disclosure. There is a different between the bulk acoustic wave resonator 640 and the bulk acoustic wave resonator 630 in the eleventh embodiment that an extension end of an upper electrode 644 is configured to be of an another convex bridge structure to enable the convex bridge structure and a portion of a piezoelectric layer 643 under it to form an air gap 647 in the enclosing manner, that is the air gap 647 is formed between the upper electrode 644 and the piezoelectric layer 643. Specifically, a portion of an upper surface, starting from a first end 6471, of the air gap 647 is a sunken arch-shaped upper surface, i.e. a partial arc with R642 being a radius, wherein R641 is larger than or equal to 10 μm and smaller than or equal to 10000 μm, and R642 is larger than or equal to 6 μm and smaller than or equal to 3200 μm; and the air gap 647 is further provided with a protruded arch-shaped upper surface connected to the sunken arch-shaped upper surface, i.e. a partial arc with R641 being a radius, the partial arc with R641 being the radius extending to a second end 6472 of the air gap 647. The extension end of the upper electrode 644 and an upper surface of the air gap 647 are in a same shape, such that the extension portion of the upper electrode 644 comprises a convex bridge structure formed by two arcs, and a highest point of an upper surface of a convex bridge is higher than an upper surface of a main body portion of the upper electrode by a distance H641, wherein H641 is larger than or equal to 50 μm and smaller than or equal to 400 μm. The whole transverse range of the air gap 647 is D644, wherein D644 is larger than or equal to 5 μm and smaller than or equal to 30 μm. A first end 6471 of the air gap 647 and a right end point of an upper bottom edge of a trapezoidal cross section of an air cavity 641 formed in the substrate 649 are located in one vertical straight line, and a second end 6472 of the air gap 647 is coincident with an intersection line formed by an arch-shaped upper surface of the piezoelectric layer 643 and an upper surface of a horizontal extension end. Through such structure configuration, the transverse-mode acoustic waves which leak to the right from the effective piezoelectric stacking position may be more sufficiently reflected.

Figure 7A:
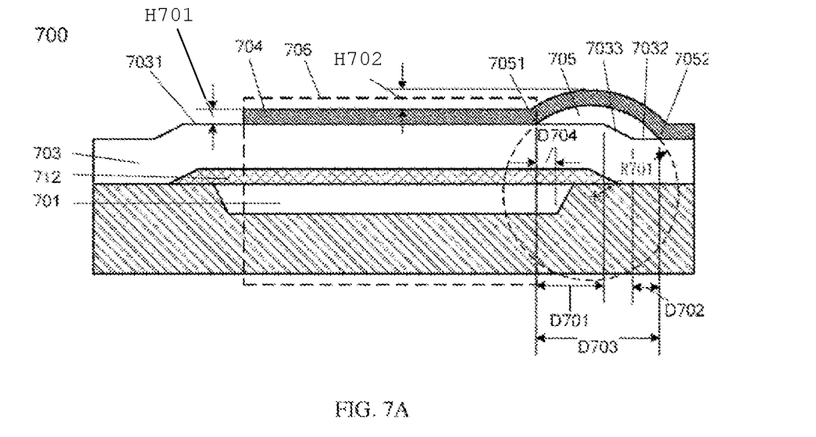

FIG. 7A shows a bulk acoustic wave resonator 700 according to a twelfth embodiment of the present disclosure. An extension end of an upper electrode 704 is configured to be of a convex bridge structure to enable an interface 7033 of the extension end of the upper electrode 704 and a piezoelectric layer 703 under it, a portion of a first step 7031 and a portion of a second step 7032 to form an air gap 705 in the enclosing manner, that is the air gap 705 is arranged between the upper electrode 704 and the piezoelectric layer 703. An upper surface, starting from the first end 7051, of the air gap 705 is a protruded arch-shaped upper surface, i.e. a partial arc with R701 being a radius, the partial arc with R701 being the radius extending to a second end 7052, going distally from an effective piezoelectric region 706, of the air gap 705.

The extension end of the upper electrode 704 has a thickness H701 and the upper surface of the air gap 705 are in a same shape, such that the extension end of the upper electrode 704 is configured to be of the convex bridge structure formed by an arc (which takes R701 as a radius, wherein R701 is larger than or equal to 10 μm and smaller than or equal to 10000 μm). An upper surface of the convex bridge structure of the upper electrode 704 is higher than an upper surface of a main body portion of the upper electrode 704 by a distance H702, wherein H702 is larger than or equal to 50 μm and smaller than or equal to 400 μm.

Furthermore, in this embodiment, the first end 7051 of the air gap 705 is coincident with the right boundary of the effective piezoelectric region 706 and remains a distance D701 with a right end point of the first step 7031 of the piezoelectric layer 703; and the first end 7051 remains a distance D704 with a right end point of a lower bottom edge of the trapezoidal air cavity 701 at the same time. The second end 7052 of the air gap 705 falls into the second step 7032 of the piezoelectric layer 703 and remains a distance D702 with a left end point of the second step 7032 of the piezoelectric layer 703. The whole transverse range of the air gap 705 is D703, wherein D703 is larger than or equal to 5 μm and smaller than or equal to 30 μm.

Figure 7B:
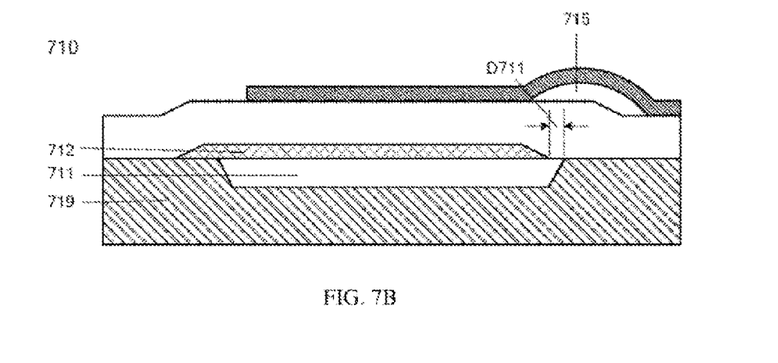

FIG. 7B shows a bulk acoustic wave resonator 710 according to a thirteenth embodiment of the present disclosure. There is a difference between the bulk acoustic wave resonator 710 and the bulk acoustic wave resonator 700 in the twelfth embodiment that the right end part of a trapezoidal lower electrode 712, i.e. the end part, proximal to an air gap 715, of the lower electrode 712 is not in contact to an upper surface of a substrate 719. Specifically, a right end point of a lower bottom edge of a trapezoidal cross section of the lower electrode 712 falls into the range of an upper bottom edge of a trapezoidal cross section of the air cavity 711 and remains a distance D711 with a right end point of the upper bottom edge. Through such structure configuration, the contact area of the lower electrode 712 and the substrate 719 may be further reduced, such that the situation that the quantity of an acoustic energy leaking from the lower electrode into the substrate is reduced is facilitated.

Figure 8A:
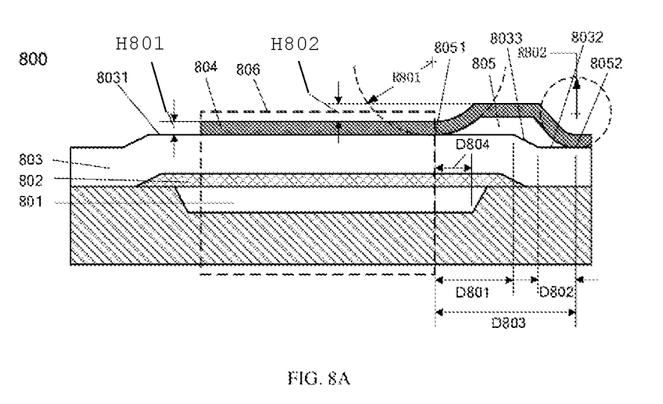

FIG. 8A shows a bulk acoustic wave resonator 800 according to a fourteenth embodiment of the present disclosure. An extension end of an upper electrode 804 has a thickness H801 and is configured to be of a convex bridge structure to enable an interface 8033 of the extension end of the upper electrode 804 and a piezoelectric layer 803 under it, a portion of a first step 8031 and a portion of a second step 8032 to form an air gap 805 in the enclosing manner, that is the air gap 805 is arranged between the upper electrode 804 and the piezoelectric layer 803.

A portion of an upper surface, starting from a first end 8051, of the air gap 805 is a sunken arch-shaped upper surface, i.e. a partial arc with R801 being a radius, the partial arc with R801 being the radius being tangent to a horizontal plane passing through the first end 8051. The air gap 805 is further provided with a flat upper surface connected to the sunken arch-shaped upper surface; and the air gap 805 is further provided with an another sunken arch-shaped upper surface connected to the flat upper surface, i.e. a partial arc with R802 being a radius, the partial arc with R802 being the radius extending to a second end 8052, going distally from an effective piezoelectric region 806, of the air gap 805, wherein R801 is larger than or equal to 6 μm and smaller than or equal to 3200 μm, and R802 is larger than or equal to 4 μm and smaller than or equal to 2800 μm.

The extension end of the upper electrode 804 and the upper surface of the air gap 805 are in a same shape, such that the extension end of the upper electrode 804 is configured to be of the convex bridge structure similar to the structure of the upper surface of the air gap 805. The upper surface of the convex bridge structure of the upper electrode 804 is higher than an upper surface of a main body portion of the upper electrode 804 by a distance H802, wherein H802 is larger than or equal to 50 μm and smaller than or equal to 400 μm.

Furthermore, in this embodiment, the first end 8051 of the air gap 805 is coincident with the right boundary of the effective piezoelectric region 806 and remains a distance D801 with a right end point of the first step 8031 of the piezoelectric layer 803; and the first end 8051 remains a distance D804 with a right end point of a lower bottom edge of a trapezoidal air cavity 801 at the same time. The second end 8052 of the air gap 805 falls into the second step 8032 of the piezoelectric layer 803 and remains a distance D802 with a left end point of the second step 8032 of the piezoelectric layer 803. The whole transverse range of the air gap 805 is D803, wherein D803 is larger than or equal to 5 μm and smaller than or equal to 30 μm.

Figure 8B:
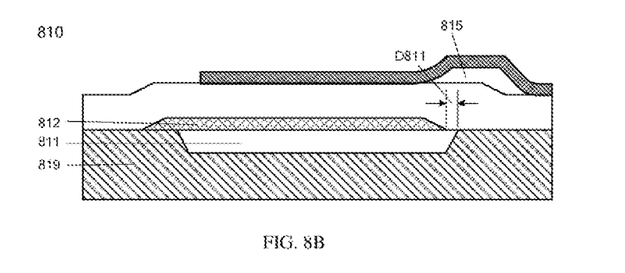

FIG. 8B shows a bulk acoustic wave resonator 810 according to a fifteenth embodiment of the present disclosure. There is a difference between the bulk acoustic wave resonator 810 and the bulk acoustic wave resonator 800 in the fourteenth embodiment that the right end part of a trapezoidal lower electrode 812, i.e. the end part, proximal to an air gap 815, of the lower electrode 812 is not in contact to the upper surface of a substrate 819. Specifically, a right end point of a lower bottom edge of a trapezoidal cross section of the lower electrode 812 falls into the range of an upper bottom edge of a trapezoidal cross section of an air cavity 811 and remains a distance D811 with a right end point of the upper bottom edge. Through such structure configuration, the contact area of the lower electrode 812 and the substrate 819 may be further reduced, such that the situation that the quantity of an acoustic energy leaking from the lower electrode into the substrate is reduced is facilitated.

It should be understood that, the bulk acoustic wave resonators in the second to fifteenth embodiments are similar to the bulk acoustic wave resonator 300 in the first embodiment in other respects, which shall not be described any further.

According to another aspect of the present disclosure, a method for manufacturing a bulk acoustic wave resonator is further provided. The method comprises the following steps:

S102, an acoustic mirror is formed on a substrate;

S104, a lower electrode deposits on the substrate and the acoustic mirror;

S106, a piezoelectric layer deposits on the lower electrode; and

S108, an upper electrode deposits on the piezoelectric layer.

The method further comprises:

before the piezoelectric layer deposits, a patterned first sacrificial layer is formed on the lower electrode and the substrate; and/or before the upper electrode deposits, a patterned second sacrificial layer is formed on the piezoelectric layer; and S110, the first sacrificial layer and the second sacrificial layer are etched to form an air gap, the air gap covering the end part, proximal to the air gap, of the lower electrode or connecting to the end part of the lower electrode;

wherein the air gap is provided with a first end proximal to an effective piezoelectric region, at least a portion of an upper surface, starting from a first end, of the air gap is an arch-shaped upper surface, and the arch-shaped upper surface is tangent to a horizontal plane passing through the first end.

In one embodiment, after the first sacrificial layer is formed, the method further comprises: adjusting a stress ratio of the piezoelectric layer to the first sacrificial layer.

A specific technological process of the bulk acoustic wave resonator is described below. One having ordinary skill in the art should understand that the technological process is intended to be illustrative, and not to limit specific technological means used in actual production implementation.

Firstly, the substrate is prepared, the upper surface of the substrate of a commodity may be further cleaned and thinned with polishing according to the actual needs, and the adoptable technical means include wet method or chemical mechanical polishing (CMP), etc. Then, the substrate is covered with a mask layer, and the mask layer may be a photoresist and also other dielectric materials such as silicon dioxide and silicon nitride. The patterned mask layer may be obtained by processes such as a photolithographic process and a reactive ion etching process. An air cavity, meeting the depth requirement, may be formed in the upper surface of the substrate further by reactive ion etching or wet etching, and a trapezoidal end surface, meeting the requirement, of the air cavity may be obtained by controlling the reactive etching condition. A sacrificial layer material further deposits on the substrate by CVD means, the sacrificial layer may be made of silicon dioxide and the like and then is flattened by the means such as CMP, and the shape and the range of the sacrificial layer are limited. According to the needs, other dielectric functional layers may be added on the sacrificial layer by a method similar to that above.

A metal layer, as a lower electrode, deposits on the substrate by magnetron sputtering means and is patterned by photolithographic and etching means, wherein a thickness and an end surface shape of the lower electrode may be implemented by controlling the magnetron sputtering conditions and the reactive etching conditions. Meanwhile, according to the needs, the first sacrificial layer may be continuously formed and patterned on the lower electrode and is configured to form an air gap below a convex bridge subsequently. Meanwhile, according to the needs, proper pressure stress may be formed in the first sacrificial layer by controlling the conditions.

The piezoelectric layer deposits on the lower electrode by CVD, and a stress ratio of the piezoelectric layer to the lower first sacrificial layer is adjusted by controlling the reaction conditions. Meanwhile, according to the needs, an additional patterned second sacrificial layer is manufactured at the upper part of the piezoelectric layer, certain pressure stress is formed, and the second sacrificial layer is configured to form an air gap below the convex bridge subsequently.

The upper electrode deposits on the piezoelectric layer by magnetron sputtering, and the stress ratio is controlled at the same time.

The sacrificial layer material is etched by a gaseous chemical reaction environment or a wet chemical environment (for example, gaseous hydrofluoric acid or liquid hydrofluoric acid equipped with a buffer agent) to release the structure, such that the air cavity of the substrate and the air gap between two film layers are formed.

For reinforcing and protecting the convex bridge structure in the present disclosure, a passivation layer with a certain thickness may be added on the partial upper surface of the upper electrode, and optional materials of a cover layer may include stable metal (such as Au and Ag) or dielectric materials (such as silicon dioxide and silicon nitride).

To sum up, for each of various forms of the bulk acoustic wave resonators according to the present disclosure, an isolation region formed by the air gap or a dielectric layer film exists on an inclined end surface of the lower electrode and is located in a region at least formed by one of the upper electrode and lower electrode and the piezoelectric layer, such that a resonant excitation portion formed by the piezoelectric layer with relatively poor growth character wound be contributed to electrical response of a whole resonator to the minimum; and meanwhile, at least one side in the upper structure and the lower structure which form the isolation region in the enclosing manner is formed by an arc, such that an acoustic reflection structure with better performance may be formed. With the above structure improvements, on one hand, the inhibition ability of the resonator to transverse-mode acoustic energy lateral leakage is improved, and the Q value of the resonator is increased at all frequencies; and on the other hand, electromechanical coupling movement of a material with a defect is greatly inhibited, and thus the effective electromechanical coupling coefficient $K^2_{t,\mathit{eff}}$ of the system is increased; and furthermore, the advantage of smooth transition brought by an arc structure greatly inhibits stress accumulation and strengthens the electrostatic discharge (ESD) immunity of the system.

The foregoing is only preferred embodiments of the present application and is not intended to limit the present application, and any modifications, equivalent substitutions, improvements and the like within the spirit and principles of the present application are intended to be embraced by the protection scope of the present application.

What is claimed is:

1. A bulk acoustic wave resonator, the bulk acoustic wave resonator comprising:
    a substrate,
    a lower electrode arranged on the substrate,
    a piezoelectric layer arranged on the lower electrode,
    an upper electrode arranged on the piezoelectric layer and an acoustic mirror arranged between the substrate and the lower electrode, and
    an air gap with an arch-shaped upper surface arranged at the external of the effective piezoelectric region, the air gap being formed between the upper electrode and the piezoelectric layer and/or between the piezoelectric layer and the substrate, and covering the end part, proximal to the air gap, of the lower electrode or connecting to the end part of the lower electrode;
    wherein mutual overlapping regions of the upper electrode, the piezoelectric layer and the lower electrode in a thickness direction form an effective piezoelectric region, and the effective piezoelectric region in the thickness direction is located in a region, in which the acoustic mirror is located; and
    wherein the air gap is provided with a first end proximal to the effective piezoelectric region, the arch-shaped upper surface is at least a portion of the upper surface of the air gap, the arch-sped upper surface of the air gap is starting from the first end proximal to the effective piezoelectric region.

2. The bulk acoustic wave resonator according to claim 1, wherein the at least a portion of the upper surface, starting from the first end, is tangent to a horizontal plane passing through the first end.

3. The bulk acoustic wave resonator according to claim 1, wherein a portion of the upper surface, starting from the first end, is a sunken arch-shaped upper surface.

4. The bulk acoustic wave resonator according to claim 3, wherein the air gap is further provided with a protruded arch-shaped upper surface connected to the sunken arch-shaped upper surface.

5. The bulk acoustic wave resonator according to claim 3, wherein the air gap is further provided with a flat upper surface connected to the sunken arch-shaped upper surface.

6. The bulk acoustic wave resonator according to claim 1, wherein a portion of the upper surface, starting from the first end, is a protruded arch-shaped upper surface.

7. The bulk acoustic wave resonator according to claim 1, wherein a portion of the upper electrode, covering the air gap and arranged at the external of the effective piezoelectric region, is provided with a highest point, the highest point being higher than a portion of the upper electrode arranged in the effective piezoelectric region.

8. The bulk acoustic wave resonator according to claim 1, wherein the portion of the upper electrode, covering the air gap and arranged at the external of the effective piezoelectric region, is not higher than the portion of the upper electrode arranged in the effective piezoelectric region.

9. The bulk acoustic wave resonator according to claim 1, wherein the lower electrode covers the acoustic mirror, and the end part of the lower electrode is directly in contact to the upper surface of the substrate.

10. The bulk acoustic wave resonator according to claim 1, wherein the lower electrode covers a portion of the acoustic mirror, and the end part, proximal to the air gap, of the lower electrode is arranged above the acoustic mirror.

11. The bulk acoustic wave resonator according to claim 1, wherein the end part of the lower electrode comprises a side edge of the lower electrode, the side edge being a vertical side edge, and the air gap is connected to the top end of the vertical side edge.

12. The bulk acoustic wave resonator according to claim 1, wherein the end part of the lower electrode comprises a side edge of the lower electrode, the side edge being an inclined side edge, and the air gap is connected to the top end of the inclined side edge.

13. The bulk acoustic wave resonator according to claim 12, wherein the top end of the inclined side edge is located farther from the effective piezoelectric region than the bottom end of the inclined side edge, and the at least a portion of the upper surface, starting from the first end, is tangent to a plane, in which the inclined side edge is located.

14. The bulk acoustic wave resonator according to claim 1, wherein the first end of the air gap is coincident with a boundary of the effective piezoelectric region.

15. The bulk acoustic wave resonator according to claim 1, wherein the acoustic mirror is an air cavity inlaid into the substrate, and the upper surface of the air cavity is flush with that of the substrate.

16. The bulk acoustic wave resonator according to claim 1, wherein the air gap is filled with a medium, the filled medium material comprising one or more or a combination of silicon dioxide, silicon nitride, silicon carbide, porous silicon, fluorinated amorphous carbon, fluorine polymer, parylene, polyarylether, hydrogen silsesquioxane, cross-linked polystyrene polymer, bisbenzocyclobutenes, fluorinated silicon dioxide, carbon doped oxide and diamond.

17. The bulk acoustic wave resonator according to claim 1, wherein a cross section of the lower electrode is a first trapezium, and an upper bottom edge of the first trapezium is smaller than a lower bottom edge of the first trapezium; and a cross section of the acoustic mirror is a second trapezium, and an upper bottom edge of the second trapezium is larger than a lower bottom edge of the second trapezium.

18. The bulk acoustic wave resonator according to claim 1, wherein the piezoelectric layer is made of any one of following materials: aluminum nitride (AlN), zinc oxide (ZnO), PZT or R-doped aluminum nitride (AlRN), wherein R, as a doped element, is a metal or non-metallic element.

19. The bulk acoustic wave resonator according to claim 1, wherein a thickness of the piezoelectric layer arranged at the external of the effective piezoelectric region is decreased progressively in a direction, going distally from the effective piezoelectric region.

\* \* \* \* \*